(12) United States Patent  
Esser (10) Patent No.: US 7,588,640 B2  
(45) Date of Patent: Sep. 15, 2009

(54) WORKPIECE CARRIER DEVICE

(75) Inventor: Stefan Esser, Aachen (DE)

(73) Assignee: Oerlikon Trading AG, Trubbach, Schweiz (CH)

(*) Notice: Subject to any disclaimer, the term of this patent is extended or adjusted under 35 U.S.C. 154(b) by 434 days.

(21) Appl. No.: 11/494,669

(22) Filed: Jul. 27, 2006

(65) Prior Publication Data

US 2007/0057138 A1 Mar. 15, 2007

(30) Foreign Application Priority Data

Aug. 29, 2005 (DE) .................. 10 2005 041 016  
Jan. 25, 2006 (CH) ........................... 0122/06

(51) Int. Cl.  
*B05C 13/02* (2006.01)

(52) U.S. Cl. .................. 118/500; 118/730; 269/55; 269/57; 269/66; 269/900

(58) Field of Classification Search .............. 118/50, 118/500, 730; 269/55, 57, 66, 900; 451/271, 451/291; 156/345.55  
See application file for complete search history.

(56) References Cited

U.S. PATENT DOCUMENTS 6,620,254 B2 * 9/2003 Zaech et al. ............... 118/730  
6,761,772 B2 * 7/2004 Giacri et al. ............... 118/730

FOREIGN PATENT DOCUMENTS

DE 39 33 911 A1 8/1990  
EP 1 153 155 B 1/2005

* cited by examiner

*Primary Examiner*—Laura Edwards  
(74) *Attorney, Agent, or Firm*—Notaro & Michalos P.C.

(57) ABSTRACT

A workpiece carrier (2) comprises a rotary frame (3) and a driving part (20), both of which are rotatable about a driving axle (4). The rotary frame (3) can be driven by a motor (6), and carries a plurality of workpiece holders (13) which are distributed around the driving axle (4) so as to be rotatable about holder axes. A driving disc (22) of the driving part (21) is in each case rotatable about an anchorage point (23) from which its center point is at a distance of an eccentricity (E). A transmission part (25) having a coupling cutout which closely receives the driving disc (22) has driving apertures (26) through which there project driving pins (19) of the workpiece holders (13), which said driving pins (19) are likewise at a distance of the eccentricity (E) from the holder axes. The driving part (20) can be driven at a greater angular velocity by the rotation of the rotary frame (3), via an auxiliary gear set (31) attached to the base frame (1). The rotary frames of a plurality of workpiece carriers can be mounted on a base frame which is itself rotatable, and they can be rotated through engagement with a stationary toothed wheel.

21 Claims, 7 Drawing Sheets

WORKPIECE CARRIER DEVICE

TECHNICAL FIELD

The invention relates to a workpiece carrier device used for processing workpieces, and in particular to those used for coating workpieces in vacuum appliances.

PRIOR ART

A workpiece carrier device of the generic type is known from, for example, EP 1 153 155 A1. In that case, the base frame is rotatable about a main axis, and is driven by an electric motor. For the purpose of driving the rotary frames of the workpiece carriers that are distributed equidistantly around the main axis, said workpiece carriers are each provided with a toothed wheel which engages with a torsionally rigid ring gear which coaxially surrounds the main axis. The workpiece holders rotatably mounted on the workpiece carriers are rotated in a similar manner, in that in each case a toothed wheel on the workpiece holder engages with a ring gear which coaxially surrounds the drive axis and which is torsionally rigid in relation to the base frame.

This known workpiece carrier device is of a relatively complex structure. The toothed wheels and ring gears require a large amount of space, and may affect the coating of the workpieces in an undesirable manner. Moreover, they are subject to high temperatures and also to the materials used for the processing of the workpieces. This can result in malfunctions, particularly obstruction of the rotary motions. Because of the given dimensions, the transmission ratios are selectable only within certain limits, which may force undesirably rapid rotation of the workpiece holders. This may possibly be controlled by means of intermediate transmissions, but the latter further complicate the structure and increase the space requirement and, moreover, increase the friction and the risk of obstruction.

In the case of one of the workpiece carrier devices disclosed by DE 198 03 278 A1, the rotation of the workpiece holders is effected by drivers which are anchored to the base frame and engage temporarily with said workpiece holders. In this case, the rotation is intermittent, which is usually disadvantageous per se and can impair the quality of the workpieces, especially when a coating consisting of a plurality of very thin layers is being applied.

PRESENTATION OF THE INVENTION

Accordingly, the object of the present invention is to create a workpiece carrier device, of the generic type, which is both simple in structure and reliable.

The advantages achieved by the invention are that, in particular, the invention allows a workpiece carrier device of the generic type, having two, or preferably three, rotational axes, to be constructed in a very simple and space-saving manner. The drive of the workpiece holders can thereby be easily so disposed that it does not affect the processing of the workpieces. Conversely, said drive can be easily protected against being subject to the same influences as the workpieces and being thereby damaged. The angular velocity of the workpiece holders can be adjusted over a wide range using relatively simple means.

BRIEF DESCRIPTION OF THE DRAWINGS

The invention is explained more fully in the following with reference to figures which represent merely exemplary embodiments, and wherein.

WAYS OF REALIZING THE INVENTION

Figure 1:
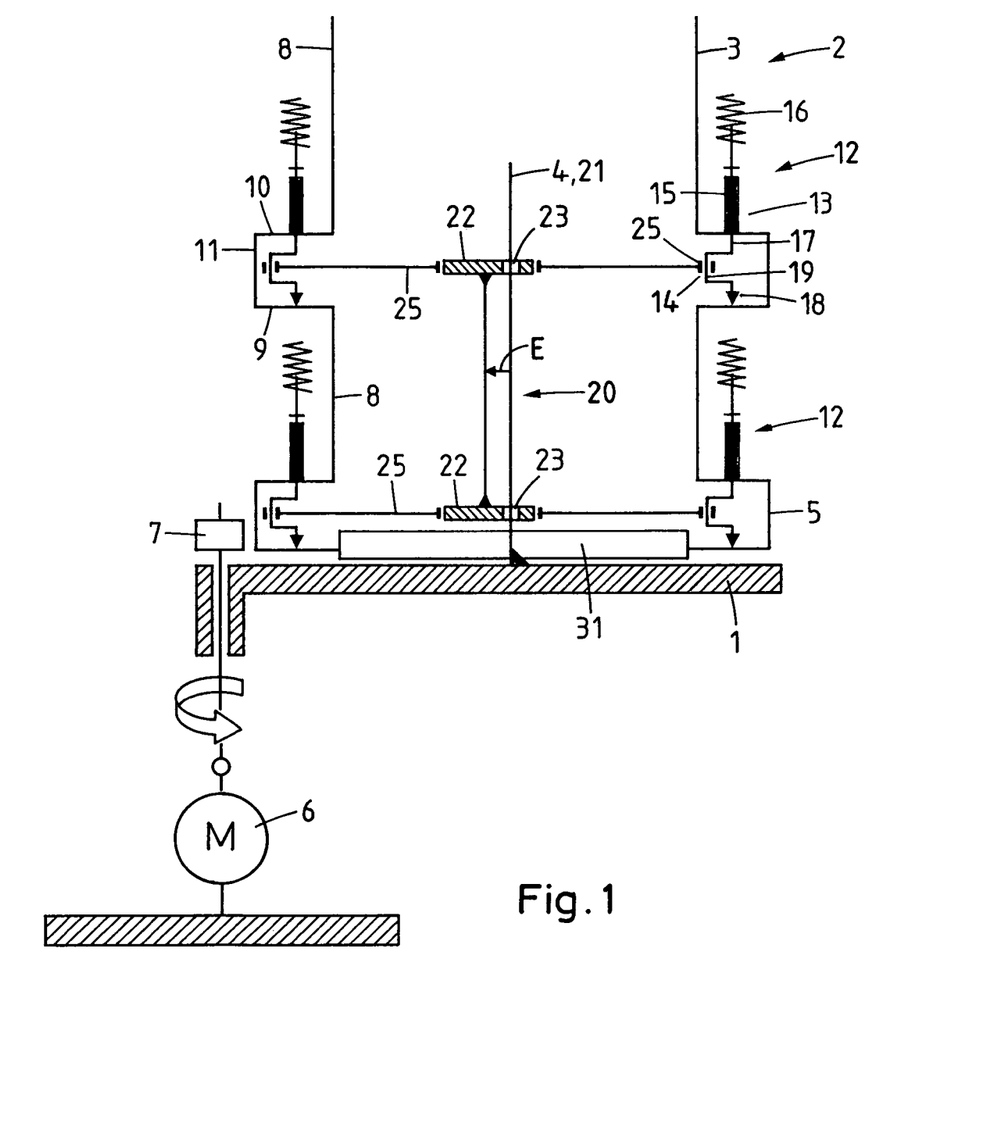
FIG. 1 shows, in schematic form, an axial section through a workpiece carrier device of the invention, according to a first embodiment.
Figure 4:
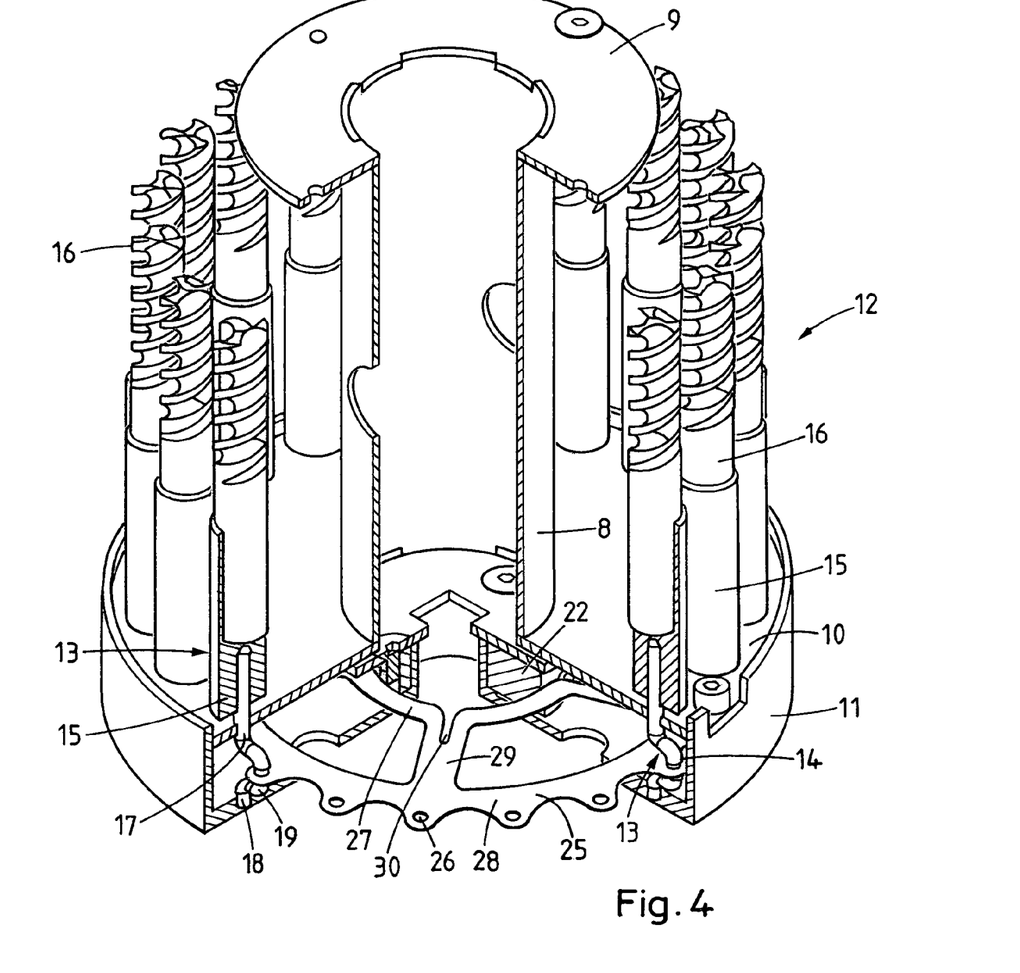
FIG. 4 shows, in partial section, a portion of the workpiece carrier device of the invention, according to the first embodiment.

According to a first embodiment of a workpiece carrier device (FIG. 1) of the invention, there is disposed on a stationary base frame 1 a workpiece carrier 2 (see also FIG. 4), having a rotary frame 3 which is mounted on the base frame 1 so as to be rotatable about vertical drive axis 4 and, at the lower end, carries on its exterior a ring gear 5 (not represented in FIG. 4) with which there engages a toothed wheel 7 driven by a motor 6. The rotary frame 3 is realized as a closed housing which is approximately rotationally symmetrical about the drive axis 4 and has central tubular portions 8 between which are located, along the drive axis 4, successive projections, each constituted by an annular bottom part 9, a likewise annular cover 10 and an outer ring 11 that is concentric relative to the tubular portions 8, said outer ring 11 being joined to the outer edge of the bottom part 9, so as to constitute a single piece with the latter, and projecting somewhat over the outer edge of the cover 10.

Figure 5:
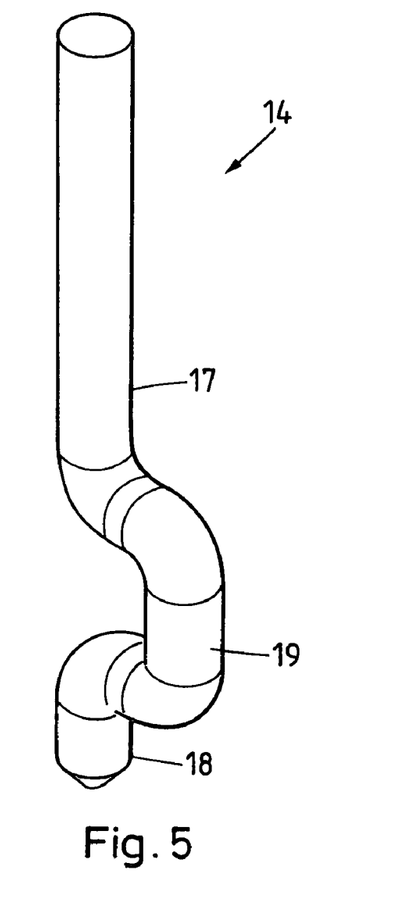
FIG. 5 shows a portion of a workpiece holder of the workpiece carrier device of the invention, according to the first embodiment.

The rotary frame 3 carries, on each of said projections, a group 12 of workpiece holders 13, respectively distributed at the same level and in a uniform manner over a circle surrounding the drive axis 4. Each workpiece holder 13 is rotatable about a holder axis that is parallel to the drive axis 4, and comprises (see also FIG. 5) a base 14, which is located partly within a projection of the rotary frame 3, and a mount 15 for securing a workpiece 16, said mount 15 being fitted onto an axle pin 17 which is brought through the cover 10 with the base 14. The base 14 furthermore comprises a bearing pin 18 having a downwardly facing conical tip, the axis of which, as in the case of the axle pin 17, is coincident with the holder axis and is rotatably mounted in the bottom part 9, where the tip engages in a corresponding recess. The bearing pin 18 and the axle pin 17 are respectively joined by a crank-type intermediate portion comprising a driving pin 19 which is parallel to, but at a distance from, the holder axis. The base 14 is a simple bent part of substantially uniform cross-section. The fitted-on mount 15 has a cylindrical recess, open at the top, into which the workpiece 16, e.g. a milling head, is inserted.

Figure 6:
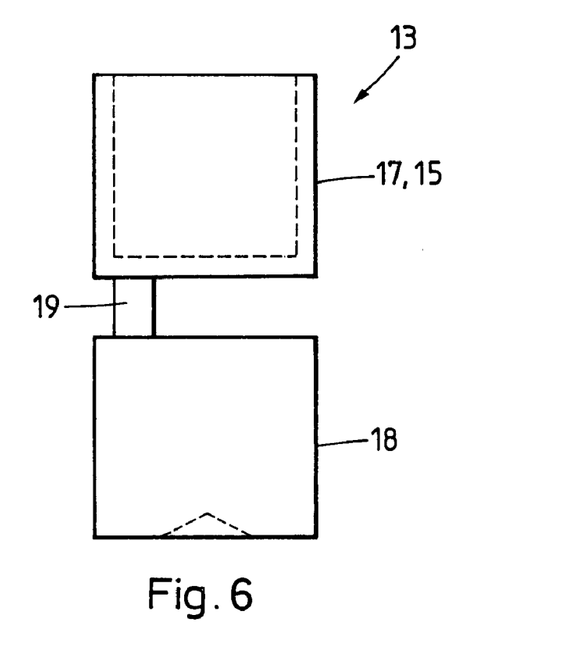
FIG. 6 shows a workpiece holder according to a modified embodiment.

According to a modified embodiment (FIG. 6), the axle pin 17 and the bearing pin 18 are each thicker in relation to the height, i.e. they are realized as cylinders, the axle pin 17 being integral with the mount 15 and having a cylindrical recess which is open at the top, and the bearing pin 18 having on its underside a conical recess in which there engages, for the purpose of mounting, a corresponding projection provided on the bottom part. The driving pin 19 is again at a distance from the holder axis.

A driving part 20 (not represented in FIG. 4), which is rotatable about the drive axis 4 in relation to the rotary frame, comprises a shaft 21 which is realized, for example, as a square bar and which is located in the drive axis 4 and carries a driving disc 22 at the level of each of the groups 12. The driving disc 22 is aligned horizontally, i.e. it is located in a plane normal to the shaft 21 to which it is connected in a torsionally rigid manner. The drive axis 4 passes through said driving disc 22 (see also FIGS. 2, 3) at an anchorage point 23, the center point, as an output point 24, of said driving disc 22 being at a distance of an eccentricity E from said anchorage point 23. The distance of the driving pin 19 of each workpiece holder 13 from the respective holder axis likewise always corresponds to the eccentricity E, the latter viewed as a vector revolving in the horizontal plane normal to the drive axis 4, with the driving part 20.

Each of the driving discs 22 is connected, via a transmission part 25, to the driving pins 19 of the group 12 of workpiece carriers 13 located on their level, said transmission part 25 having a circular central coupling cutout whose edge closely surrounds the driving disc 22, and is also connected, for each workpiece holder 13, to a driving aperture 26 through which there projects the driving pin 19 of said workpiece holder 13, said driving pin 19 being closely surrounded by the edge of said driving aperture 26, such that the transmission part 25 is in each case connected in a rotatable manner, but otherwise with little play, both to the driving part 20 and to the workpiece holders 13. If the base 14 of the workpiece holder 13 is realized as in FIG. 5, it can be threaded very easily into the driving aperture 26, and the mount 15 subsequently fitted on.

Figure 2:
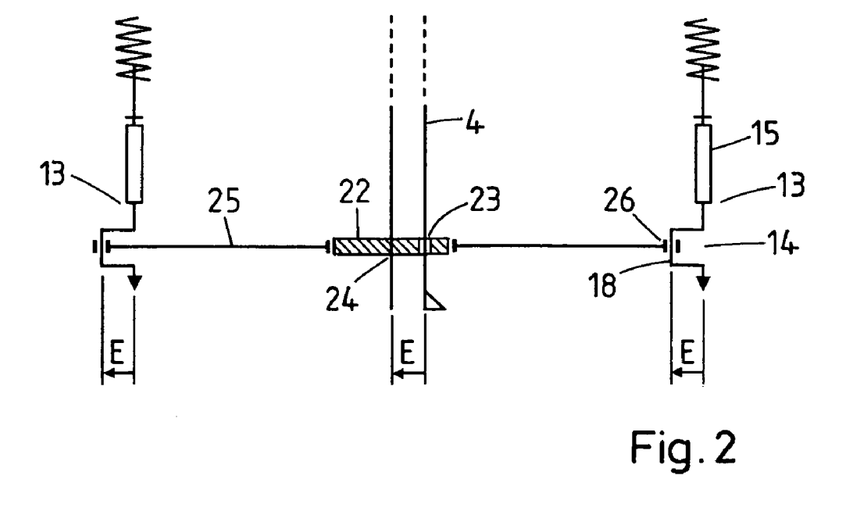
FIG. 2 shows a detail from FIG. 1.
Figure 3:
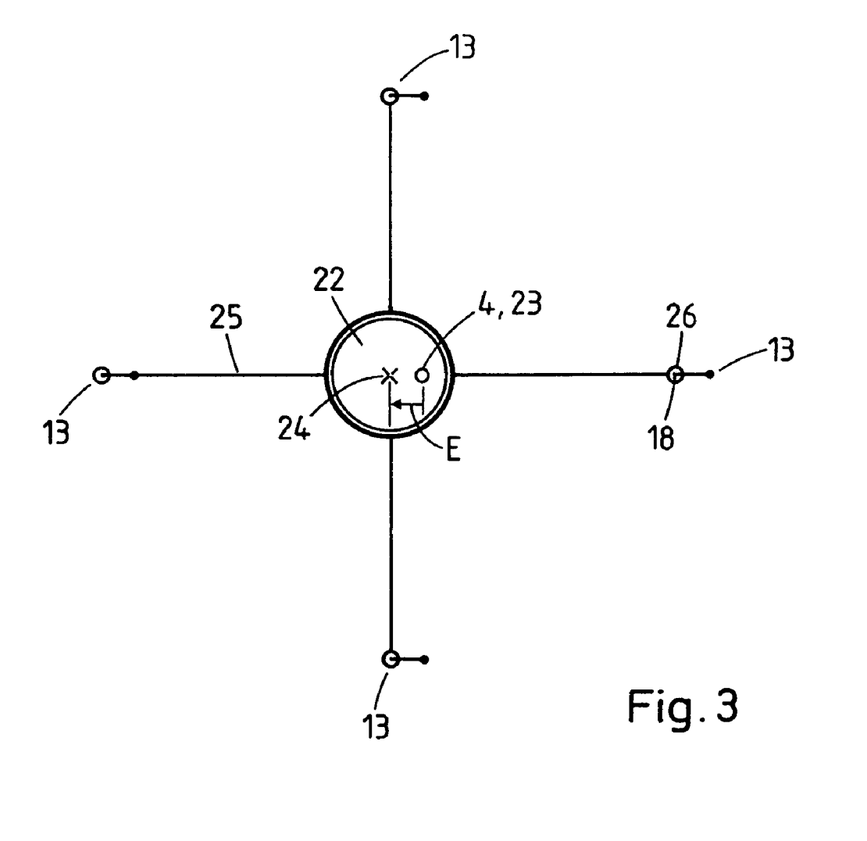
FIG. 3 shows a top view of the detail according to FIG. 2.
Figure 7:
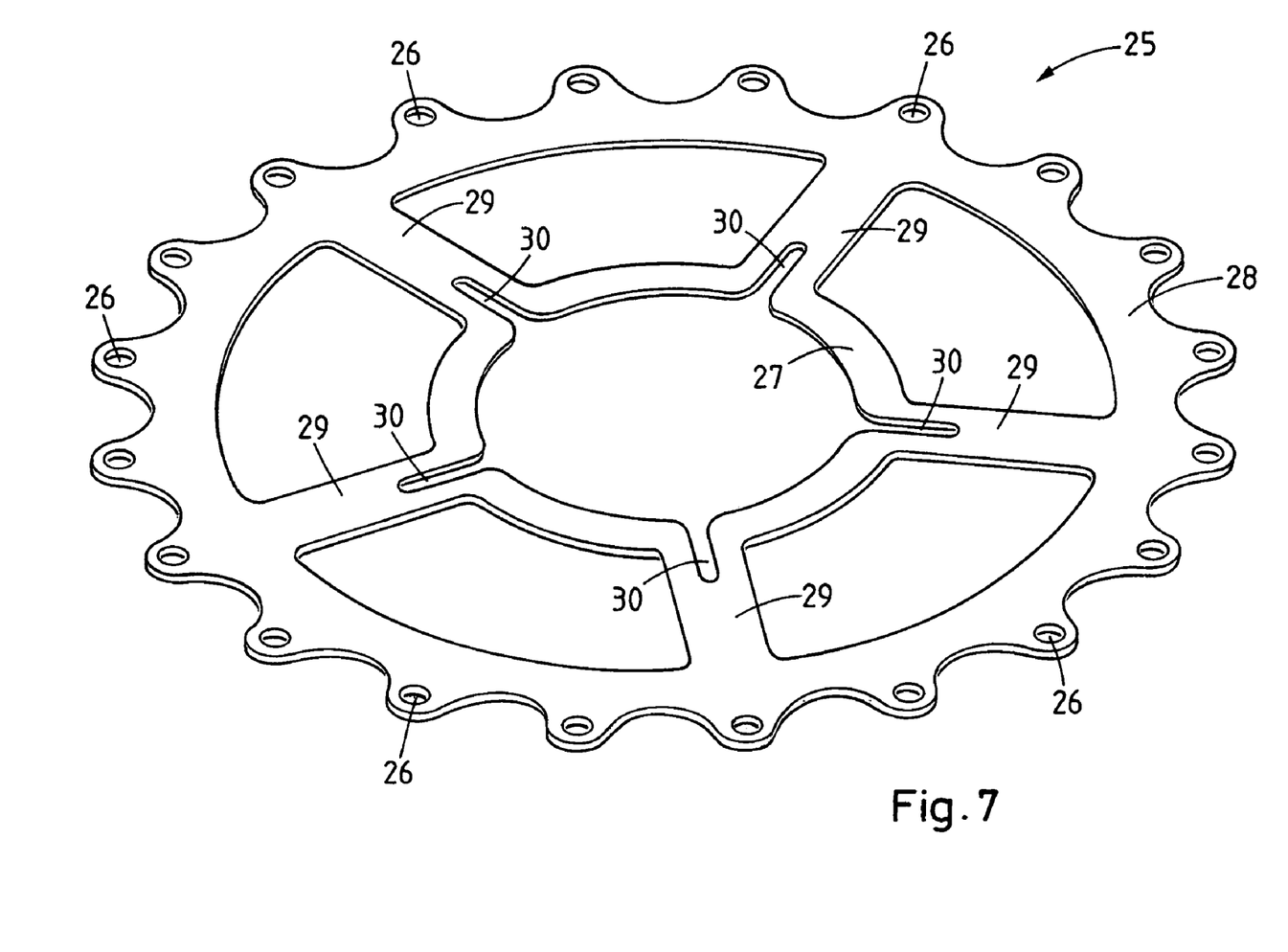
FIG. 7 shows a transmission part of the workpiece carrier device of the invention, according to the first embodiment.

The transmission part 25, which is represented in schematic form only in FIGS. 2, 3, may be realized as a flat stamped part (see FIG. 7) having an inner ring 27, which surrounds the said coupling cutout, and an outer ring 28, in which there are provided, distributed over the circumference, in this case twenty driving apertures 26 for engagement with the same number of workpiece carriers 13. The inner ring 27 and the outer ring 28 are connected through radial spokes 29 which, in the example, are weakened by radial slots 30 going out from the central coupling cutout, such that they constitute predetermined breaking points which break in the event of an obstruction of one of the workpiece holders 13 of the respective group 12.

Figure 8:
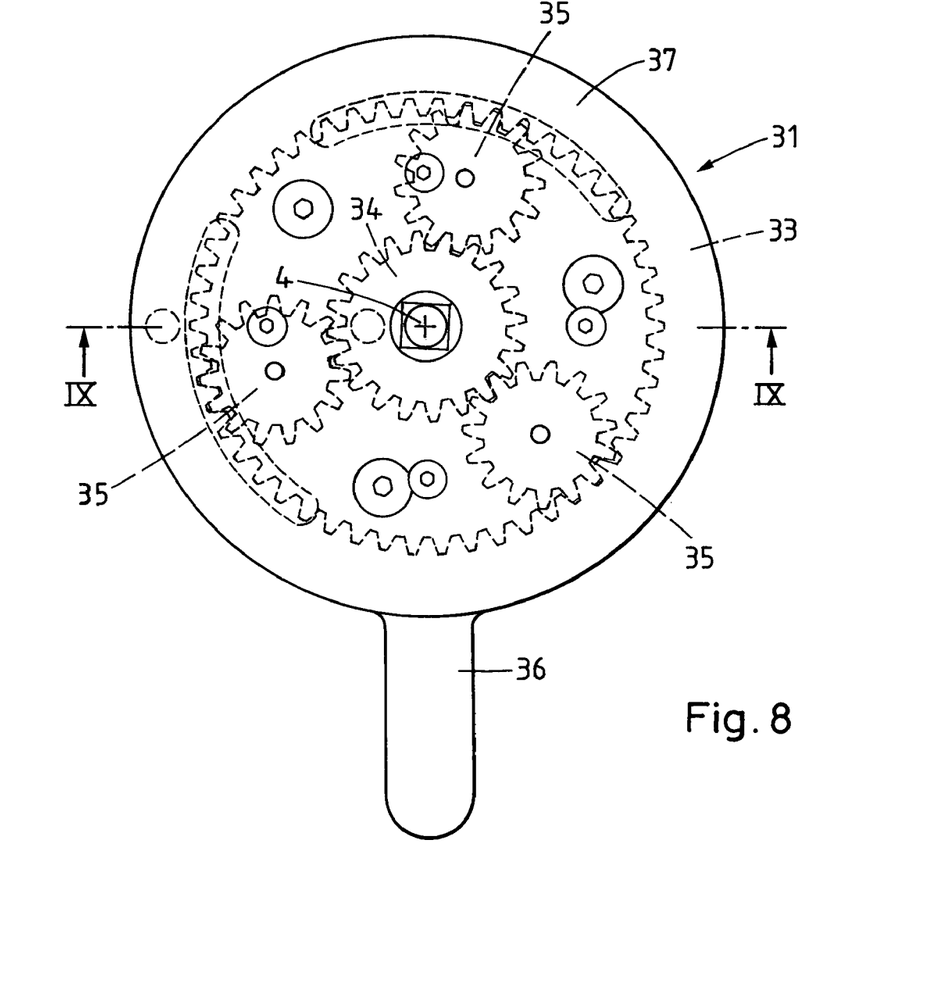
FIG. 8 shows a top view of an auxiliary gear set of the workpiece carrier device of the invention, according to the first embodiment.
Figure 9:
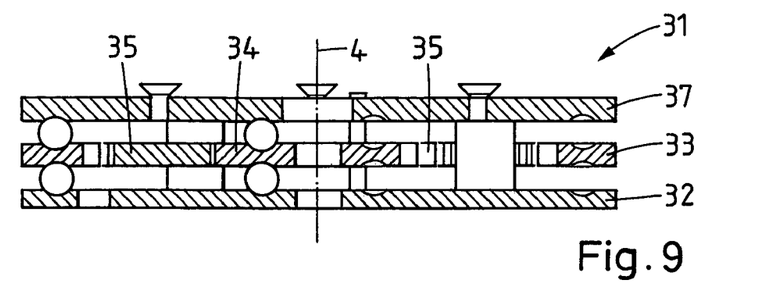
FIG. 9 shows a section along IX-IX in FIG. 8 through the auxiliary gear set.

The shaft 21 is connected to the output of an auxiliary gear set 31 which is attached to the base frame 1. The gear set 31 is realized as a planetary gear set (FIGS. 8, 9), having a base plate 32, which is screwed onto the base frame 1, and a ring gear 33 mounted on said base plate 32 so as to be rotatable about the drive axis 4, and a sun gear 34, which is connected in a torsionally rigid manner to the output of the auxiliary gear set 31 and thereby to the shaft 20, and which is likewise mounted on the base plate 32 so as to be rotatable about the drive axis 4. The sun gear 34 is surrounded by three equal planetary gears 35, which are rotatable about axes that are parallel to the drive axis 4, and which engage both with the ring gear 33 and with the sun gear 34. The ring gear 33 has an outwardly projecting stem-like projection 36 which, upon rotation of the rotary frame 3, strikes against the latter such that the ring gear 33, upon further rotation of the rotary frame 3 in the same direction, is torsionally rigid in relation to said rotary frame 3 and is rotated together with it. The projection 36 thus constitutes the drive of the auxiliary gear set 31. The auxiliary gear set 31 is additionally closed by a cover plate which is screwed onto the base plate 32 and which has a central aperture for the shaft 21.

When the rotary frame 3 is rotated about the drive axis 4 by the motor 6, the projection 36 is driven concomitantly and the ring gear 33 of the auxiliary gear set 31 is rotated concomitantly, such that the driving part 20 is rotated about the drive axis 4, this being at a greater angular velocity, corresponding to the transmission ratio of the auxiliary gear set 31, which ratio can be selected from a wide range. Each of the driving discs 22 attached eccentrically to the shaft 21 causes the respective transmission part 25 acting in combination with said driving disc 22 to be likewise subjected to a circular motion having a radius corresponding to the length of the eccentricity E, but without said transmission part 25 being rotated concomitantly, owing to its engagement with the driving pins 19 of the workpiece holders 13 of the respective group 12. The driving pins 19 are driven concomitantly by the motion of the transmission part 25, and likewise execute a circular motion, having a radius corresponding to the length of the eccentricity E, about the respective holder axes, resulting in a corresponding rotation of the workpiece carriers 13 about said axes.

The design of the first exemplary embodiment described may be modified in many respects without departure from the scope of the invention. Thus, instead of driving discs for connecting the shaft to the transmission part, it is also possible to provide cranks, each of which is connected to the shaft in a torsionally rigid manner and rotatably connected to the respective transmission part in particular, the shaft may have crank-type outward bends, similar to the workpiece holder according to FIG. 5. The transmission part could also be of a different design, e.g. star-shaped. What is crucial is that there is an eccentric driving part which is rotatable about the drive axis, i.e. a driving part having an eccentric output point at which it engages rotatably with the transmission part, while the transmission part likewise engages rotatably with a likewise eccentric drive point on the respective workpiece holder. The number of workpiece holders driven via a transmission part may vary over a wide range, but each transmission part should engage with at least two, so that it cannot execute any uncontrolled motions. The workpiece holders may also be disposed at different distances from the drive axis, rendering possible a more dense arrangement. It is also possible for the workpiece holders of each second group to be directed downwards in such a way that their mounts point towards those of the next-lower group, and for the one or other mounts to be sprung, such that workpieces that are otherwise difficult to fix in position can in each case be clamped between a lower and an upper mount.

The connection between the driving part and the transmission part may also be realized by means of ball-bearings, as may the connection between the transmission part and the workpiece holders, particularly the driving pins of same. The auxiliary gear set may be replaced by a separate drive, or the driving part may also be anchored directly onto the base frame, though the orientation of the workpieces while revolving about the drive axis remains the same relative to the base frame. Different, or additional, predetermined breaking points may also be provided, e.g. at the connection between the shaft on the one hand and each of the driving discs or cranks on the other hand, or at each workpiece holder or its connection to the transmission part. The design of the rotary frame as a closed housing has the advantage that it protects the driving mechanism against the influences to which the workpieces are subjected, but other realizations are not thereby precluded. Finally, a plurality of rotary frames may be disposed around the toothed wheel and driven, via the latter, by a common motor.

Figure 10:
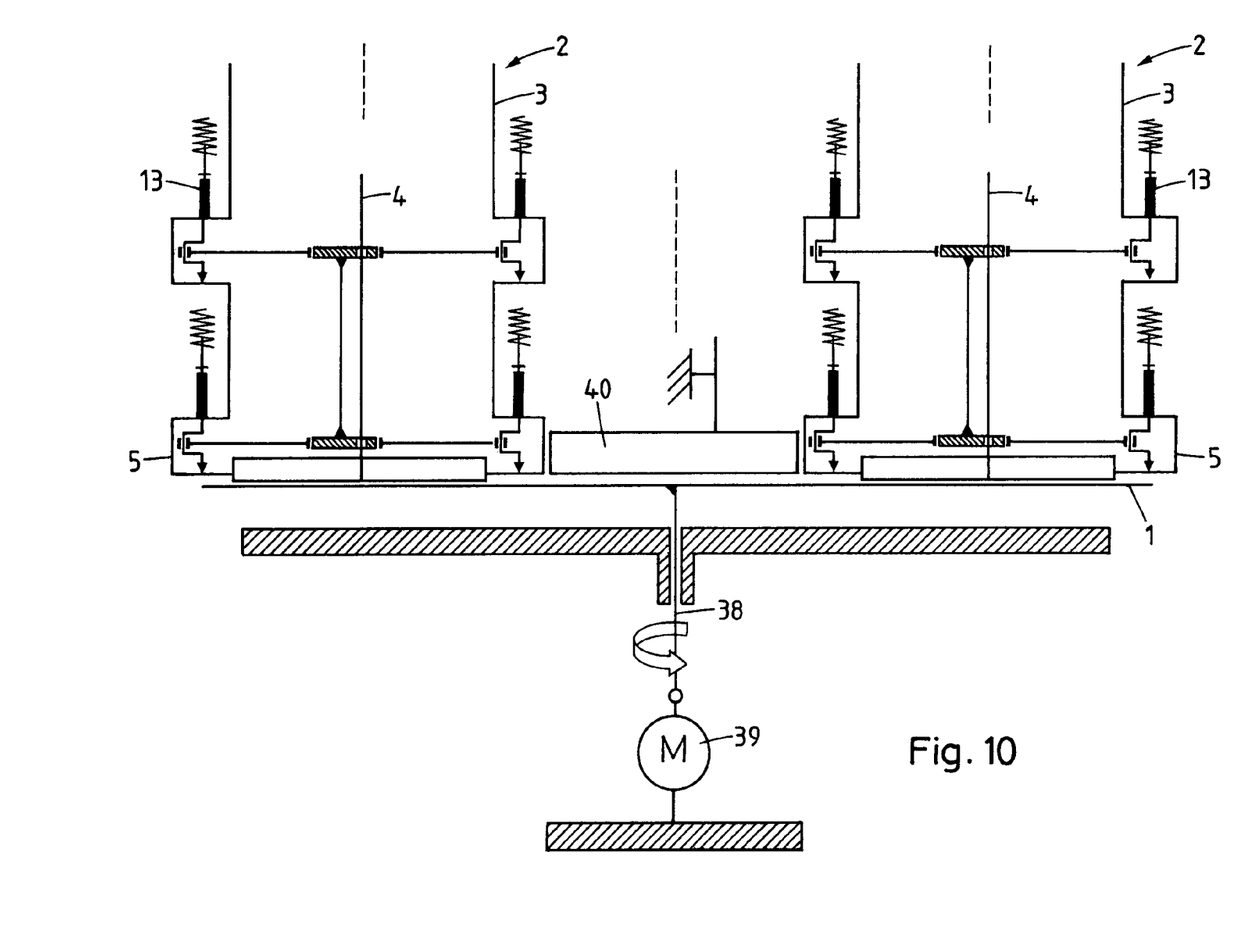
FIG. 10 shows, in schematic form, an axial section through a workpiece carrier device of the invention, according to a second embodiment.

FIG. 10 shows a second embodiment of a workpiece carrier device according to the invention. Here, a plurality of workpiece carriers 2, corresponding to that described in connection with the first exemplary embodiment, are disposed around a main axis 38 about which the base frame 1 can be rotated by a motor 39. The ring gears 5 engage with a stationary toothed wheel 40. Owing to the engagement of the ring gears 5 with the toothed wheel 40, rotation of the base frame 1 causes each of the rotary frames 3 to be rotated about the respective drive axis 4, while the workpiece carriers 2 revolve about the main axis 38. The workpiece carriers 2 thus constitute, in a manner known per se, planetary elements which revolve about the main axis 38 and about which elements, in turn, revolve the rotating workpiece carriers 13, as moon elements, a single drive effecting all motions. In other respects, the functioning of the workpiece carriers 2 corresponds exactly to that described in connection with the first exemplary embodiment. The variations in the design of the workpiece carriers from the represented example that are stated there are also possible in this case.

The invention claimed is:

1. A workpiece carrier device comprising:
   at least one workpiece carrier which comprises a rotary frame, mounted on a base frame so as to be rotatable about a drive axis;
   an eccentric driving part which is rotatable about the drive axis in relation to the rotary frame and having an eccentric position with respect to an output point;
   a plurality of workpiece holders which are at a distance from the drive axis and are mounted on the rotary frame so as to be rotatable about holder axes that are parallel to said drive axis; and
   at least one rigid transmission part, for rotating each workpiece holder both about its holder axis and in relation to the rotary frame, wherein the output point of said eccentric driving part engages rotatably with said rigid transmission part and said rigid transmission part likewise engages rotatably with a drive point having a correspondingly eccentric position to the holder axis of each respective workpiece holder.

2. A workpiece carrier device according to claim 1, wherein the driving part comprises a driving disc which is aligned perpendicularly relative to the drive axis and whose center point constitutes the output point, and which is mounted at an anchorage point coinciding with the drive axis, the transmission part having a circular coupling cutout whose edge surrounds the driving disc.

3. A workpiece carrier device of claim 1, wherein each workpiece holder comprises a driving pin of round cross-section, which is parallel to the holder axis and which engages with a corresponding driving aperture on the transmission part.

4. A workpiece carrier of claim 3, wherein each workpiece holder comprises a base at which the drive point is located, with an axle pin mounted on the rotary frame so as to be rotatable about the holder axis, and has a mount which is mounted on the axle pin for securing the workpiece.

5. A workpiece carrier device of claim 4, wherein the base of each workpiece holder comprises a bearing pin which is mounted on the rotary frame so as to be rotatable about the holder axis, and an intermediate portion bent outwards laterally in the manner of a crank, which connects the bearing pin to the axle pin and includes a driving pin, of round cross-section, which is parallel to the holder axis and which engages with a corresponding driving aperture on the transmission part.

6. A workpiece carrier device of claim 4, wherein the rotary frame is a closed housing which surrounds the driving part and each transmission part, and also the portion of the base of each of the workpiece holders at which the drive point is located, the axle pin of said workpiece holders being brought outwards through the housing.

7. A workpiece carrier device of claim 1, the workpiece carrier comprising a group of workpiece holders which are disposed at the same level around the drive axis, as well as a transmission part which engages with all workpiece holders of the group.

8. A workpiece carrier of claim 7, where the workpiece holders of the group are distributed uniformly over a circle surrounding the drive axis, and the transmission part comprises a ring with driving apertures distributed in corresponding manner over the same, each engaging with a driving pin of one of the holders which is parallel to the holder axis.

9. A workpiece carrier device of claim 7, the workpiece carrier comprising a plurality of groups of workpiece holders distributed along the drive axis.

10. A workpiece carrier device of claim 1, where the driving part is operatively connected to the base frame in such a way that, upon rotation of the rotary frame, the driving part rotates in relation to the base frame at an angular velocity which differs from that of said rotary frame.

11. A workpiece carrier device of claim 10, where the driving part is connected in a torsionally rigid manner to an output of an auxiliary gear set anchored on the base frame, and a drive of said auxiliary gear set is connected to the rotary frame in such a way that it is concomitantly driven by the rotary motion of the rotary frame.

12. A workpiece carrier device of claim 11, where the auxiliary gear set is a planetary gear set, with a ring gear connected to the drive, a sun gear which is connected to the output and coaxially surrounded by the ring gear, and with at least one planetary gear which engages with the ring gear and with the sun gear.

13. A workpiece carrier device of claim 10, comprising a plurality of workpiece carriers whose drive axes are parallel to a main axis about which the base frame is rotatable.

14. A workpiece carrier device of claim 13, where the workpiece carriers surround the main axis, and the rotary frame of each workpiece carrier carries a ring gear which engages with a stationary toothed wheel which is coaxial with the main axis.

15. A workpiece carrier device comprising:
   at least one workpiece carrier which comprises a rotary frame, mounted on a base frame so as to be rotatable about a drive axis;
   an eccentric driving part which is rotatable about the drive axis in relation to the rotary frame and having an eccentric position with respect to an output point;
   a plurality of workpiece holders which are at a distance from the drive axis and are mounted on the rotary frame so as to be rotatable about holder axes that are parallel to said drive axis; and
   at least one rigid transmission part, for rotating each workpiece holder both about its holder axis and in relation to the rotary frame, wherein the output point of said eccentric driving part engages rotatably with said rigid transmission part and said rigid transmission part likewise engages rotatably with a drive point having a correspondingly eccentric position to the holder axis of each respective workpiece holder;

wherein each workpiece holder comprises a driving pin of round cross-section, which is parallel to the holder axis and which engages with a corresponding driving aperture on the transmission part; and wherein each workpiece holder comprises a base, at which the drive point is located, with an axle pin mounted on the rotary frame so as to be rotatable about the holder axis, and has a mount, which is mounted on the axle pin, for securing the workpiece.

16. A workpiece carrier device of claim 15, wherein the base of each workpiece holder comprises a bearing pin which is mounted on the rotary frame so as to be rotatable about the holder axis, and an intermediate portion bent outwards laterally in the manner of a crank, which connects the bearing pin to the axle pin and includes a driving pin of round cross-section which is parallel to the holder axis and which engages with a corresponding driving aperture on the transmission part.

17. A workpiece carrier device of claim 16, wherein the rotary frame is a closed housing which surrounds the driving part and each transmission part, and also the portion of the base of each of the workpiece holders at which the drive point is located, the axle pin of said workpiece holders being brought outwards through the housing.

18. A workpiece carrier device comprising:
   at least one workpiece carrier which comprises a rotary frame, mounted on a base frame so as to be rotatable about a drive axis;
   an eccentric driving part which is rotatable about the drive axis in relation to the rotary frame and having an eccentric position with respect to an output point;
   a plurality of workpiece holders which are at a distance from the drive axis and are mounted on the rotary frame so as to be rotatable about holder axes that are parallel to said drive axis; and
   at least one rigid transmission part, for rotating each workpiece holder both about its holder axis and in relation to the rotary frame, wherein the output point of said eccentric driving part engages rotatably with said rigid transmission part and said rigid transmission part engages rotatably with a drive point having a correspondingly eccentric position to the holder axis of each respective workpiece holder;
   where the driving part is operatively connected to the base frame in such a way that, upon rotation of the rotary frame, the driving part rotates in relation to the base frame at an angular velocity which differs from that of said rotary frame; and
   where the driving part is connected in a torsionally rigid manner to an output of an auxiliary gear set anchored on the base frame, and a drive of said auxiliary gear set is connected to the rotary frame in such a way that it is concomitantly driven by the rotary motion of the latter.

19. A workpiece carrier device of claim 18, where the auxiliary gear set is realized as a planetary gear set, with a ring gear connected to the drive, a sun gear which is connected to the output and coaxially surrounded by the ring gear, and with at least one planetary gear which engages with the ring gear and with the sun gear.

20. A workpiece carrier device of claim 19, comprising a plurality of workpiece carriers whose drive axes are parallel to a main axis about which the base frame is rotatable.

21. A workpiece carrier device of claim 20, where the workpiece carriers surround the main axis, and the rotary frame of each workpiece carrier carries a ring gear which engages with a stationary toothed wheel which is coaxial with the main axis.

\* \* \* \* \*